United States Patent [19]
Yoneda et al.

[11] Patent Number: 5,946,704
[45] Date of Patent: Aug. 31, 1999

[54] ASSOCIATIVE MEMORY TO RETRIEVE A PLURALITY OF WORDS

[75] Inventors: Masato Yoneda; Hiroshi Sasama, both of Tokyo, Japan

[73] Assignee: Kawasaki Steel Corporation, Kobe, Japan

[21] Appl. No.: 08/386,868

[22] Filed: Feb. 10, 1995

[30] Foreign Application Priority Data

Feb. 10, 1994 [JP] Japan .................................. 6-016428
Oct. 21, 1994 [JP] Japan .................................. 6-256683

[51] Int. Cl.⁶ .................................................. G11C 15/00
[52] U.S. Cl. .......................... 711/108; 711/156; 711/158; 365/49
[58] Field of Search ................................ 395/435; 365/49, 365/189.01, 230.01; 711/108, 156, 158

[56] References Cited

U.S. PATENT DOCUMENTS

| | | | |
|---|---|---|---|
| 4,296,475 | 10/1981 | Nederlof et al. | 395/435 |
| 4,575,818 | 3/1986 | Almy et al. | 365/49 |
| 4,907,194 | 3/1990 | Yamada et al. | 365/49 |
| 4,959,811 | 9/1990 | Szczepanek | 365/49 |
| 4,975,873 | 12/1990 | Nakabayashi et al. | 365/49 |
| 4,996,666 | 2/1991 | Duluk, Jr. | 365/49 |
| 5,072,422 | 12/1991 | Rachels | 365/49 |
| 5,122,984 | 6/1992 | Strehler | 365/49 |
| 5,319,762 | 6/1994 | Mayer | 395/435 |
| 5,406,508 | 4/1995 | Hayashibara | 365/49 |
| 5,440,715 | 8/1995 | Wyland | 395/435 |
| 5,465,228 | 11/1995 | Sasama | 365/49 |
| 5,479,366 | 12/1995 | Sasama | 365/49 |
| 5,483,480 | 1/1996 | Yoneda | 365/49 |
| 5,485,418 | 1/1996 | Hiraki et al. | 365/49 |
| 5,530,665 | 6/1996 | Yoneda | 365/49 |
| 5,555,397 | 9/1996 | Sasama et al. | 395/485 |
| 5,568,416 | 10/1996 | Kawana et al. | 365/49 |
| 5,619,446 | 4/1997 | Yoneda et al. | 365/49 |

FOREIGN PATENT DOCUMENTS 0635842  1/1995  European Pat. Off. ........ G11C 15/00

*Primary Examiner*—Eddie P. Chan
*Assistant Examiner*—Hong Kim
*Attorney, Agent, or Firm*—Oliff & Berridge, PLC

[57] ABSTRACT

The associative memory may include a plurality of memory words storing storage data, flag registers each corresponding to an associated one of the plurality of memory words, a gate circuit having signal lines each corresponding to an associated one of the plurality of memory words and a priority encoder for designating one of the memory words. An address converter may convert the address of one of the memory words output from the priority encoder into a representative address. The storage data may include a pair of attribute indicative of positioning in the data group to which the storage data belongs. In at least one embodiment, match lines each corresponding to an associated one of the plurality of memory words and a plurality of encode coding circuits may be provided.

8 Claims, 12 Drawing Sheets

GROUP NO.

ATTRIBUTE

| | I | II | III | IV |
|---|---|---|---|---|
| 1 | A | B | C | D |
| 2 | C | F | G | H |
| 3 | J | K | L | M |
| 4 | C | A | B | D |
| ⋮ | ⋮ | ⋮ | ⋮ | ⋮ |

Fig.12

PRIOR ART

ASSOCIATIVE MEMORY TO RETRIEVE A PLURALITY OF WORDS

BACKGROUND OF THE INVENTION

1. Field of the Invention

The present invention relates to an associative memory having a function of expanding a data width to be subjected to a match retrieval to a plurality of words, or such a function that when the respective matches are detected through continuous of retrievals, a match as the whole is detected.

2. Description of the Related Art

Hitherto, there has been proposed an associative memory (a content addressable memory) having a plurality of arranged memory words each storing digital data, in which retrieval data is applied to retrieve the memory word or words storing digital data having a bit pattern which matches with a bit pattern of a whole or a predetermined part of the applied retrieval data.

FIG. 10 is a circuit block diagram of the conventional associative memory by way of example.

Referring to FIG. 10, an associative memory 10 is provided with a number of memory words 11_1, 11_2, ..., 11_n each consisting of a m-bit of memory cell, arranged in a transverse direction of the figure, a word being expressed with "m" bits. Further, the associative memory 10 comprises a retrieval data register 12 which is adapted to latch a word of retrieval data when it is applied thereto. A bit pattern of the whole or a predetermined part of the retrieval data latched in the retrieval data register 12 is compared with a bit pattern of the portion corresponding to the bit pattern of the latched storage data with respect to data stored in each of the memory words 11_1, 11_2, ..., 11_n. As a result of the comparison, if there are found any of the memory words 11_1, 11_2, ..., 11_n of which the bit pattern is coincident with that of the retrieval data, a match signal expressed as a logic "1" (e.g. 5 volts) will appear on the associated ones of match lines 14_1, 14_2, ..., 14_n which are provided in conjunction with the memory words 11_1, 11_2, ..., 11_n, respectively. On the other hand, a mismatch signal expressed as a logic "0" (e.g. 0 volt) will appear on the remaining ones of the match lines 14_1, 14_2, ..., 14_n.

The match lines 14_1, 14_2, ..., 14_n are connected through output lines 91, 92, ..., n of flag registers 15_1, 15_2, ..., 15_n, respectively to a priority encoder 16. The signals supplied to the match lines 14_1, 14_2, ..., 14_n are stored in the flag registers 15_1, 15_2, ..., 15_n, respectively. Now, assuming that the signals "0", "1", "1", "0", ..., "0", "0" appear on the flag registers 15_1, 15_2, ..., 15_n, respectively, these signals are applied to a priority encoder 16. The priority encoder 16 is so arranged to receive encode pulses (EP) and sequentially output an address signal AD corresponding to the flag register given with a higher priority among the flag registers (here, only two flag registers 15_2 and 15_3) which store the signals given by a logic "1", in accordance with a predetermined priority sequence, whenever the priority encoder 16 receives the encode pulse EP. Supposing that the higher priority is given with younger suffix, in this case, when the priority encoder 16 receives the encode pulse EP by one, the memory address associated with the flag register 15_2 is outputted. Thus, the priority encoder 16 outputs the address signal (AD) corresponding to the flag registers 15_2, which address signal AD may be passed to an address decoder 17, if necessary. The address decoder 17 decodes the received address signal AD and outputs an access signal (here logic "1" of signal) to the associated one (here a word line 18_2) of word lines 18_1, 18_2, ..., 18_n which are provided in conjunction with the memory words 11_1, 11_2, ..., 11_n, respectively. Thus, storage data stored in the word memory 11_2 associated with the word line 18_2 on which the access signal appears is read out to an output register 19.

Next, further application of the encode pulse EP makes it possible now to derive an address of the memory word 11_3 associated with the flag register 15_3.

As described above, according to the associative memory 10, the storage data stored in a number of memory words 11_1, 11_2, ..., 11_n are retrieved using the retrieval data in its entirety or a part specified, so that an address of the memory word involved in the matched data is generated, and in accordance with the necessity the whole data stored in the memory word can be read out.

With respect to the associative memory having the fundamental structure as mentioned above, there has been proposed a technology as to expansion of the data width as an object of a match retrieval into two or more words.

FIG. 11 is a block diagram of an associative memory, by way of example, provided with a data expansion function. In FIG. 11, the same parts are denoted by the same reference numbers as those of FIG. 10, and the redundant description will be omitted.

Match lines 14_1, 14_2, ..., which are extended from the memory words 11_1, 11_2, ..., respectively, are connected to ones of two input terminals of AND gates 20_1, 20_2, ..., respectively. Connected to the other ones of the two input terminals of the AND gates 20_1, 20_2, ... are output terminals of OR gates 21_2, 21_3, ..., respectively. Ones of two input terminals of the OR gates 21_2, 21_3, ... are connected to a first time retrieval control line 22. An OR gate associated with the AND gates 20_1 is omitted. The other input terminal of the AND gates 20_1 is directly connected to the first time retrieval control line 22.

Output terminals of the AND gates 20_1, 20_2, ... are connected to data input terminals of first flag registers 23_1, 23_2, ..., respectively. Output terminals of the first flag registers 23_1, 23_2, ... are connected to output terminals of second flag registers 24_1, 24_2, ..., respectively. Output terminals of the second flag registers 24_1, 24_2, ... are connected to the priority encoder 16 shown in FIG. 10 (omitted in FIG. 11), respectively, and in addition to the other ones of the input terminals of the OR gates 21_2, 21_3, ..., respectively, which correspond each to the associated one of memory words adjacent to each other downwards in FIG. 11.

Pairs of first and second flag registers 23_1, 24_1; 23_2, 24_2; ... correspond to the flag registers 15_1; 15_2, ... shown in FIG. 10, respectively.

Applied to both the first flag registers 23_1, 23_2, ... and the second flag registers 24_1, 24_2, ... are a match result latch signal S1 which appears on a match result latch control line 25, so that input data entered from the respective data input terminals are latched. In the first flag registers 23_1, 23_2, ..., there are latched the input data involved in the time point of a rising edge a of the match result latch signal S1. On the other hand, in the second flag registers 24_1, 24_2, ..., there are latched the input data involved in the time point of a trailing edge b of the match result latch signal S1.

In the associative memory arranged as mentioned above, a match retrieval is performed in accordance with a manner as described below. It is now assumed, as shown in the FIG.

11, that the memory words 11_1, 11_2, 11_3, 11_4, 11_5, 11_6, . . . store retrieval data A, B, C, D, C, F, . . . respectively.

To retrieve solely individual retrieval data, a first time retrieval timing signal S2 is supplied to the first time retrieval control line 22, when the retrieval is performed through inputting the retrieval data REF-DATA. Assuming that data "B" is inputted as the retrieval data REF-DATA, a logic "1" of match signal appears on the match line 14_2 associated with the memory word 11_2 in which data "B" has been stored, and is supplied to the AND gate 20-2. Simultaneously, the first time retrieval timing signal S2 is supplied via the first time retrieval control line 22 through the OR gate 21_2 to the AND gate 20_2. As a result, the AND gate 20_2 produces a logic "1" of signal. On the other hand, since logic "0" of signals appear on the other match lines 14_1, 14_3, 14_4, . . . , respectively, the associated AND gates 20-1, 20_3, 20_4, . . . produce logic "0" of signals, respectively.

The logic "1" of signal outputted from the AND gate 20_2 is latched by the first flag register 23_2 in timing of the rise-up edge a of the match result latch signal S1 appearing on the match result latch control line 25, and then latched by the second flag register 24_2 in timing of the subsequent trailing edge b of the match result latch signal S1.

On the other hand, logic "0" of signals are latched by the other first flag registers 23_1, 23_3, 23_4, . . . in the same timing as the logic "1" of signal is latched by the first flag register 23_2, and logic "0" of signals are latched by the other second flag registers 24_1, 24_3, 24_4, . . . in the same timing as the logic "1" of signal is latched by the second flag register 24_2.

In this manner, signals expressed by logic "0", "1", "0", . . . , which are latched by the second flag registers 24_1, 24_2, 24_3, . . . , respectively, are supplied to the priority encoder 16 as shown in FIG. 10 to generate an address signal AD of the memory word 11_2.

Next, there will be explained such a case where a retrieval involved in expansion of the data width is performed. Here, a case where two-word data consisting of data "B" and data "C" is retrieved, by way of example, will be explained.

In the same manner as the above-mentioned case, first, a retrieval of the data "B" is performed. As a result, signals expressed by logic "1" are latched by the first flag register 23_2 and the second flag register 24_2, respectively, which are associated with the memory word 11_2. Next, the data "C" is inputted as the retrieval data REF-DATA for retrieval. At that time, the time retrieval timing signal S2 is not supplied to the first time retrieval control line 22, and the first time retrieval control line 22 is kept logic "0". Performing the retrieval through inputting the data "C" as the retrieval data REF-DATA will induce match signals expressed by logic "1" on the match lines 14_3 and 14_5 which are associated with the memory words 11_3 and 11_5, respectively. Since the logic "1" of signal latched by the second flag register 24_2 has been supplied to the OR gate 21_3, the match signal appearing on the match line 14_3 is passed via the AND gate 20_3 to the first and second flag registers 23_3 and 24_3, so that a signal expressed by logic "1" representative of a match is latched by the first and second flag registers 23_3 and 24_3. On the other hand, since the logic "0" of signal latched by the second flag register 24_4 has been supplied to the OR gate 21_5, the match signal appearing on the match line 14_5 is inhibited by the AND gate 20_5, so that a signal expressed by logic "0" representative of a mismatch is latched by the first and second flag registers 23_5 and 24_5. In this manner, there is carried out a match retrieval for two-word data consisting of a pair of data "B" and data "C". Likewise, a match retrieval for three-word data or more word data may be implemented.

While the associative memory shown in FIG. 11 is provided with a data width expansion function, it is necessary for data to be expanded to two-word, three-word and so on to be stored in mutually adjacent memory words in a predetermined order, and thus it is impossible to perform a match retrieval in combination of plural data, in a case where plural data to be retrieved are stored in the reversed order, for example, in sequence of data "C" and data "B", or in a case where they are stored in mutually distant memory words.

FIG. 12 shows a data structure which needs the retrieval as mentioned above. In FIG. 12, there is shown a data structure in which each data group is constituted of a set of data consisting of four data appended with attributes I, II, III and IV, respectively. Now, in order to clarify a concept of the data groups and the attributes, an example will be given. For instance, each of data groups assigned with the group numbers 1, 2, 3, 4 . . . is associated with data involved in an individual, attribute I denotes a name of the associated person, attribute II denotes the date of birth of the associated person, attribute III denotes the address of the associated person, . . . and so on.

In case of retrieval under storage of data groups, each consisting of a plurality of data appended with the attributes I, II, III and IV as mentioned above, into an associative memory, for instance, when data of the group number 1 is retrieved, the following various situations may occur by way of example. As one situation, there is considered such a case that the retrieval of data "A" and the retrieval of data "B" are performed in the named order and then the remaining data "C" and "D" involved in the matched data group are read. Further, sometimes it is desired that for example, the retrieval of data "A" and the retrieval of "D" are performed and then the remaining data "B" and "C" are read. Alternatively, sometimes it is desired that first the retrieval of data "B" is performed and then the retrieval of "A" is performed.

However, it is impossible for the above-mentioned associative memory (refer to FIG. 11) having the word width expansion function to perform those retrievals as mentioned above. Further, according to the above-mentioned associative memory, when the retrieval of data "A" and data "B" is performed, it is impossible to distinguish between a pair of data "A" appended with attribute I and data "B" appended with attribute II each associated with the group number 1 shown in FIG. 12 and a pair of data "A" appended with attribute II and data "B" appended with attribute III each associated with the group number 4 shown in FIG. 12. Specifically, assuming that attribute I stands for "name" and attribute II "one's date of birth", when it is desired on the basis of information as to those attributes I and II to detect information as to attributes III and IV of a specified individual who matches the attributes I and II, it may happen that a match is detected through even a pair of attributes II and III.

In order to solve the problems as mentioned above, there has been proposed in Japanese Patent Application No. 248121/1993 a new associative memory which makes it possible to perform also a retrieval involved in a discontinuous attribute.

However, this associative memory involves such a problem that with respect to data in a series of data groups, for example, a retrieval is performed for each attribute, a management of addresses for a match or a mismatch is complicated and then it is complicated to treat memory word groups each storing a data group as units.

SUMMARY OF THE INVENTION

In view of the foregoing, it is therefore an object of the present invention to provide an associative memory capable of facilitating the treatment of the memory word groups each storing data group in units.

To achieve the above-mentioned object of the present invention, according to the present invention, there is provided the first associative memory in which a number of storage data are stored, retrieval data is entered, storage data associated with the entered retrieval data is retrieved, comprising:

(1) a plurality of memory words each for storing storage data constituting a plurality of data groups each comprising a plurality of storage data of sets, (2) wherein each of the memory words is provided with an associated address, and (3) a plurality of memory word groups each comprising a plurality of memory words for storing a plurality of storage data constituting the data group have each an associated representative address.

In the first associative memory as mentioned above, it is preferable that said representative address is one of a plurality of addresses each corresponding to an associated one of a plurality of memory words constituting the memory word group associated with said representative address.

Further, in the first associative memory as mentioned above, in a case where said storage data consist of each a pair of attribute indicative of positioning in the data group to which the storage data belongs and data to which the attribute is appended, it is preferable that said representative address is an address associated with a memory word storing a predetermined attribute representative of the respective attributes constituting said data group among a plurality of memory words constituting the memory word group associated with said representative address.

On the other hand, the first associative memory as mentioned above can be embodied, with respect to an arrangement in which when a match is detected, a memory word group involved in detection of the match is identified by an address in units of memory word groups, as follows:

That is, according to the present invention, there is provided the second associative memory in which a number of storage data are stored, retrieval data is entered, storage data associated with the entered retrieval data is retrieved, comprising:

(4) a plurality of memory words each for storing storage data constituting a plurality of data groups each comprising a plurality of storage data of sets; and (5) an address output circuit arranged to output a representative address, when storage data associated with retrieval data entered is detected through a retrieval, said representative address being associated with a memory word group to which a memory word storing an associated storage data belongs, among a plurality of memory word groups each comprising a plurality of memory words for storing a plurality of storage data constituting the data group.

More specifically, said address output circuit referenced in item (5) comprises: for example, (5_1) match lines each corresponding to an associated one of said plurality of memory words, each adapted to be enabled when the associated memory word stores storage data associated with retrieval data entered;

(5_2) a priority encoder for generating an address of one of memory words associated with the enabled match lines in accordance with a predetermined priority sequence; and (5_3) an address converter for converting the address of said one memory word, which is outputted from said priority encoder, into a representative address associated with a memory word group to which said one memory word belongs.

It is acceptable that the match lines referenced in item (5_1) are connected directly to the priority encoder referenced in item (5_2), or connected through circuits for holding, modifying or transmitting the signals on the match lines, such as a flag register, a gate circuit, a switch and the like, to the priority encoder referenced in item (5_2). The present invention includes both the aspects as mentioned above.

In the associative memory having the address output circuit satisfying the structural requirements of items (5_1) to (5_3), in a case where said storage data consist of each a pair of attribute indicative of positioning in the data group to which the storage data belongs and data to which the attribute is appended, it is preferable that said address converter of item (5_3) performs addition or subtraction of the address of said one memory word and a relative address between said one memory word and a memory word storing a predetermined attribute representative of respective attributes constituting said data group among a plurality of memory words constituting a memory word group to which said one memory word belongs, thereby generating a representative address associated with said memory word group.

Further, in the second associative memory as mentioned above, it is preferable that for example, said storage data consist of each a pair of attribute indicative of positioning in the data group to which the storage data belongs and data to which the attribute is appended, and said address output circuit of item (5) comprises:

(5_4) match lines each corresponding to an associated one of said plurality of memory words, each adapted to be enabled when the associated memory word stores storage data associated with retrieval data entered; and (5_5) a plurality of encode coding circuits each corresponding to an associated one of said attributes for generating a representative address associated with a memory word group to which a memory word associated with a match line enabled belongs, said plurality of encode coding circuits being selected in accordance with said attribute at the time of retrieval.

Furthermore, it is acceptable to arrange the associative memory in such a manner that for example, said storage data consist of each a pair of attribute indicative of positioning in the data group to which the storage data belongs and data to which the attribute is appended, and said address output circuit of item (5) comprises:

(5_6) match lines each corresponding to an associated one of said plurality of memory words, each adapted to be enabled when the associated memory word stores storage data associated with retrieval data entered;

(5_7) an encode coding circuit for generating, upon receipt of information indicative of the fact that the match line is enabled, an address according to an input position of said information; and (5_8) a switching circuit arranged to be controlled by said attribute at the time of retrieval for inputting said information to said encode coding circuit upon shifting the input position by the corresponding difference between an address of a memory word associated with a match line enabled and a representative address associated with a memory word group to which said memory word belongs.

Still further, it is acceptable to arrange the associative memory in such a manner that said address output circuit of item (5) comprises: for example, (5_9) a plurality of match lines each corresponding to an associated one of said plurality of memory words, each adapted to be enabled when the associated memory word stores storage data associated with retrieval data entered;

(5_10) a gate circuit having a plurality of signal line s each corresponding to an associated one of said plurality of memory words, said gate circuit being operative, when any one of said plurality of match lines each corresponding to an associated one of said plurality of memory words constituting said memory word group is enabled at the time of retrieval, to enable the signal line associated with a memory word which stores storage data representative of a data group to which the storage data stored in the memory word associated with the enabled match line belongs; and (5_11) a priority encoder for generating an address of one of the memory words, which is associated with the enabled signal line, in accordance with a predetermined priority sequence, and for outputting said address thus generated as a representative address associated with the memory word group to which said one memory word belongs.

It is acceptable, in a similar fashion to that of the match lines referenced in item (5_1), that the signal lines referenced in item (5_10) are connected directly to the priority encoder, or connected through circuits for holding, modifying or transmitting the signals on the signal lines, such as a flag register, a gate circuit, a switch and the like, to the priority encoder.

Further, it is acceptable to provide between the match lines referenced in item (5_9) and the signal lines referenced in item (5_10) not only the gate circuit referenced in item (5_10), but also circuits for holding, modifying or transmitting the signals on the match lines, such as a flag register, another gate circuit, a switch and the like.

In the associative memory having the address output circuit satisfying the structural requirements of items (5_9) to (5_11), it is preferable that said storage data consist of each a pair of attribute indicative of positioning in the data group to which the storage data belongs and data to which the attribute is appended, and said gate circuit is operative, when the attribute stored in said memory word is a predetermined attribute representative of the respective attributes constituting said data group, and any one of said plurality of match lines each corresponding to an associated one of said plurality of memory words constituting the memory word group to which the memory word storing said predetermined attribute belongs is enabled, to enable the associated signal line.

On the other hand, the first associative memory as mentioned above can be embodied, with respect to an arrangement in which a memory word group is identified as to whether it is in the "storage state" or in the "empty state" in units of memory word groups, as follows:

That is, according to the present invention, there is provided the third associative memory in which a number of storage data are stored, retrieval data is entered, storage data associated with the entered retrieval data is retrieved, comprising:

(6) a plurality of memory words each for storing storage data constituting a plurality of data groups each comprising a plurality of storage data of sets;

(7) flag registers each corresponding to an associated one of said plurality of memory words for storing an empty flag indicative of the fact that the associated memory word is in a storage state storing effective retrieval data as an object of retrieval, or in an empty state storing no effective retrieval data and thus permitting overwrite;

(8) a gate circuit having signal lines each corresponding to an associated one of said plurality of memory words, said gate circuit being operative, when the storage data stored in said memory word is storage data representative of the data group to which said storage data belongs, and the flag register associated the memory word storing said storage data stores the empty flag indicative of the empty state, to enable the associated signal line; and (9) a priority encoder for designating one of the memory words associated with said signal lines, which is associated with the signal line enabled by said gate circuit, in accordance with a predetermined priority sequence.

It is acceptable that in the third associative memory as mentioned above said storage data consist of each a pair of attribute indicative of positioning in the data group to which the storage data belongs and data to which the attribute is appended, and said gate circuit is operative, when the attribute stored in said memory word is a predetermined attribute representative of the respective attributes constituting said data group, and the flag register associated the memory word storing said predetermined attribute stores the empty flag indicative of the empty state, to enable the associated signal line.

According to the first associative memory of the present invention, the memory words have each the associated address, and the memory word groups have each the associated representative address. Consequently, there is avoided such a troublesomeness that for example, a plurality of addresses are assigned to a single memory word group, by means of adopting such a fashion that in case of the access in units of memory word groups, their representative address is used, alternatively in case of the access of anyone of the memory words within the memory word group, the representative address and the relative address of the memory word group are used. Thus, it is possible to facilitate the treatment in units of memory word groups.

The use of one of addresses of a plurality of memory words constituting the memory word group, for example, the youngest address in number among such a plurality of addresses, as the representative address, rather than the use of an address of a system which is quite different from an address associated with the memory word, as the representative address associated with the memory word group, may provide a simple address system in which the address of the memory word and the address of the memory word group are linked.

In a case where the storage data consist of each an attribute and data to which the attribute is appended, assigning an address of a memory word storing a predetermined attribute among the attributes, for example, the smallest attribute in number as the representative address of the memory word group to which the memory word belongs makes it possible to provide a circuit in which the representative address is automatically defined through storing the storage data in the memory words.

According to the second associative memory of the present invention, there is provided the address output circuit, as referenced in item (5), for outputting the representative address. Thus, there is no need to perform such a troublesome operation that a plurality of addresses are assigned externally to a single memory word, thereby facilitating the treatment in units of memory word groups and thus providing an associative memory which is excellent in operational efficiency.

Incidentally, information as to whether a match is detected finally in a series of retrieval is outputted from only a single match line for each memory word group. Consequently, even if all a plurality of match lines each corresponding to the associated one of a plurality of memory words constituting a memory word group are connected to the priority encoder, it does not take a redundant time to identify the memory word group on which the match is detected, different from the situation in the third associative memory in which the memory word group in the empty state is identified.

According to the third associative memory of the present invention, there is provided such a function that outputs of the empty flag registers each corresponding to the associated one of the memory words are applied to the priority encoder through the gate circuit for determining whether the memory word is one representative of the memory word group in which a single data group is stored. Thus, the priority encoder determines whether the memory word groups are each in the empty state, thereby providing a higher speed of retrieval as to whether the memory word groups are each in the empty state, and thus enhancing a speed of data write.

As described above, according to the first associative memory, the memory word groups have each the representative address. This feature makes it possible to facilitate the treatment in units of memory word groups (data groups). Further, the second associative memory is equivalent to that in which the first associative memory is specified in generation of addresses of the memory word groups on which a match is detected. Thus, according to the second associative memory, there is no need to perform such a troublesome operation that a plurality of addresses are assigned externally to a single memory word, thereby facilitating the treatment in units of memory word groups and thus providing an associative memory which is excellent in operational efficiency.

Furthermore, the third associative memory is equivalent to that in which the first associative memory is specified in generation of addresses of the memory word groups which are each in the empty stated. According to the third associative memory, the priority encoder receives data indicative of whether only the memory word representative of the memory word group storing the data group is in the empty state. Thus, it is determined whether the memory word groups are each in the empty state, and it is possible to retrieve at high speed the address of the memory word to which data is to be written.

BRIEF DESCRIPTION OF THE DRAWINGS

FIG. 12 is an illustration showing group structure of data by way of example.

DESCRIPTION OF PREFERRED EMBODIMENTS

Preferred embodiments of the present invention will be explained in detail referring to Japanese Patent Application Serial Number 248121/1993, hereinafter.

Incidentally, it is noted that the embodiment of the second associative memory of the present invention or the embodiment of the third associative memory of the present invention implies the embodiment of the first associative memory of the present invention. Thus, hereinafter, there will be described the embodiment of the second associative memory of the present invention or the embodiment of the third associative memory of the present invention.

Figure 6:
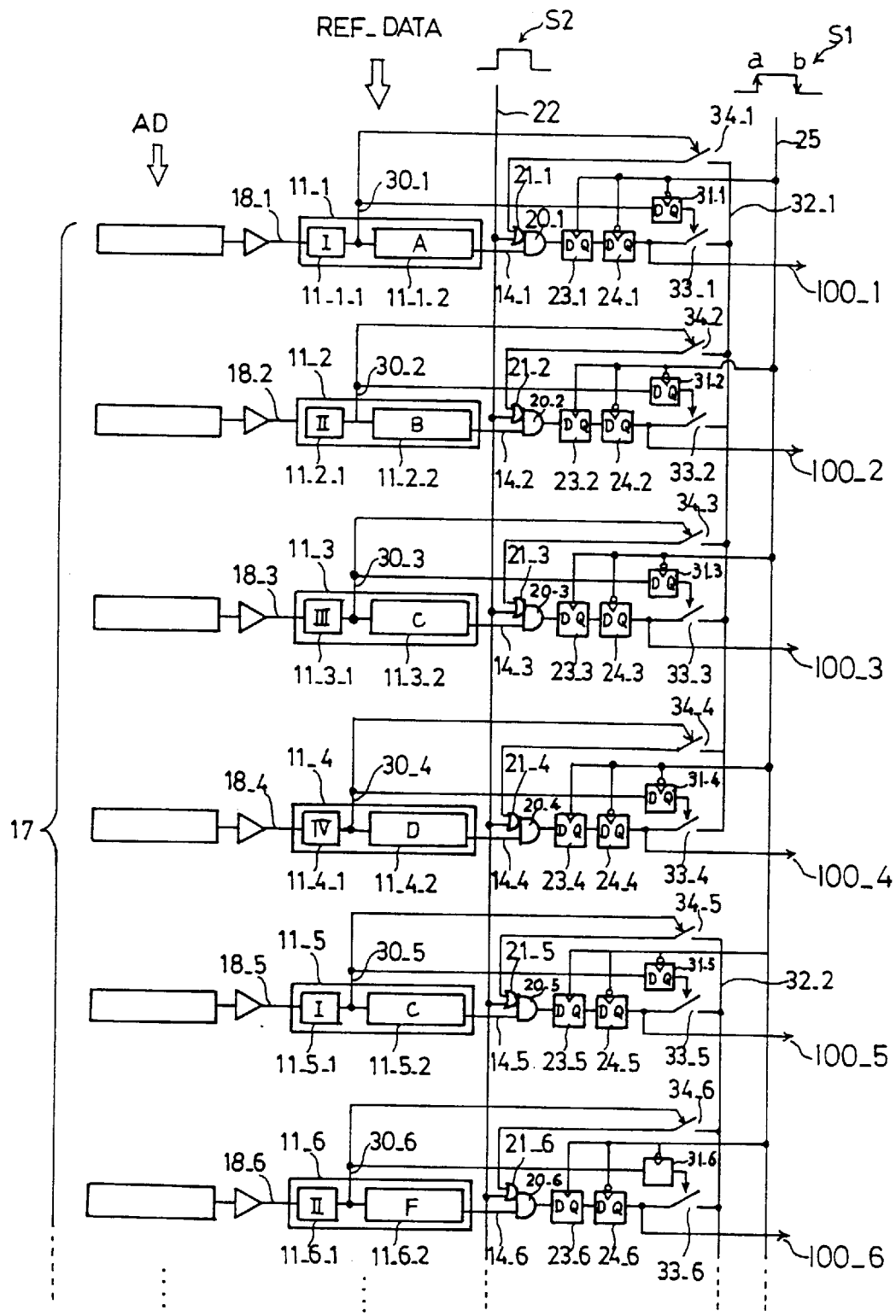
FIG. 6 is a block diagram of an associative memory by way of example.

FIG. 6 is a block diagram of one embodiment of the associative memory involved in the earlier Japanese Patent application referenced above. In FIG. 6, the same parts are denoted by the same reference numbers as those of FIG. 11. Only different points will be described.

Memory words $11\_1$, $11\_2$, . . . comprise attribute storage units $11\_1\_1$, $11\_2\_1$, . . . each for storing an attribute and data storage units $11\_1\_2$, $11\_2\_2$, . . . each for storing data, respectively. The memory words each store storage data consisting of a pair of mutually associated attribute and data. As shown in FIG. 6, it is assumed that the memory words $11\_1$, $11\_2$, $11\_3$ and $11\_4$ store attribute I and data 'A', attribute II and data 'B', attribute III and data 'C' and attribute IV and data 'D', respectively, which belong to the group number 1 shown in FIG. 12. Similarly, the memory words $11\_5$, $11\_6$, . . . store attribute I and data 'C', attribute II and data 'F', . . . , respectively, which belong to the group number 2 shown in FIG. 6. To effect the retrieval, retrieval data REF_DATA, which consists of a pair of attribute and data, is applied.

The memory words $11\_1$, $11\_2$, . . . are provided with attribute match lines $30\_1$, $30\_2$, . . . , to which each signal representative of a match or mismatch concerning only the attribute is supplied, as well as the match lines $14\_1$, $14\_2$, . . . , respectively, to which each a match signal is supplied when the storage data (both the attribute and the data) coincides with the applied retrieval data (both the attribute and the data). With respect to detection of a match of only the attribute and a match of both the attribute and the data, it is possible to implement such a function with the use of the conventional match detection circuit. Thus, the illustration of such a match detection circuit and the explanation will be omitted.

There are provided third flag registers 31_1, 31_2, ..., which are associated with the memory words 11_1, 11_2, ..., respectively. The attribute match lines 30_1, 30_2, ... are extended to data input terminals of the associated third flag registers 31_1, 31_2, ..., respectively. Further, in this associative memory, there are provided data lines 32_1, 32_2, ... each on the associated memory word group comprising memory words each storing data belonging to the associated data group shown in FIG. 12. Furthermore, there are provided first switches 33_1, 33_2, ... between the data lines 32_1, 32_2, ... and output terminals of the second flag registers 31_1, 31_2, ..., respectively. The first switches 33_1, 33_2, ... are each constituted of a transistor and the like. Also with respect to other switches described later, it is the same as this constitution. The first switches 33_1, 33_2, ... turn on when the associated third flag registers 33_1, 33_2, ... each latch a logic "1" of signal, respectively, and they turn off when latching a logic "0" of signal. The third flag registers 31_1, 31_2, ... latch signals appearing on the associated attribute match lines 30_1, 30_2, ..., respectively, in timing of the trailing edge b of the match result latch signal S1 which appears on the match result latch control line 25.

Furthermore, there are provided second switches 34_1, 34_2, ... between the data lines 32_1, 32_2, ... and input terminals of OR gates 21_1, 21_2, ..., respectively. The second switches 34_1, 34_2, ... are controlled in such a manner that they turn on when signals of the associated attribute match lines 30_1, 30_2, ... each take a logic level "1" representative of a match, and they turn off when taking a logic "0" representative of a mismatch. In order to provide a stabilization of an input level of each of the OR gates 21_1, 21_2, .... at the time of turn off of the second switches, it is acceptable to insert a pull-down resister or to adopt another circuit system. Incidentally, the associative memory shown in FIG. 6 is provided with, different from that shown in FIG. 5, an OR gate 21_1 before the AND gate 20_1 associated with the uppermost stage of memory word 11_1.

Figure 11:
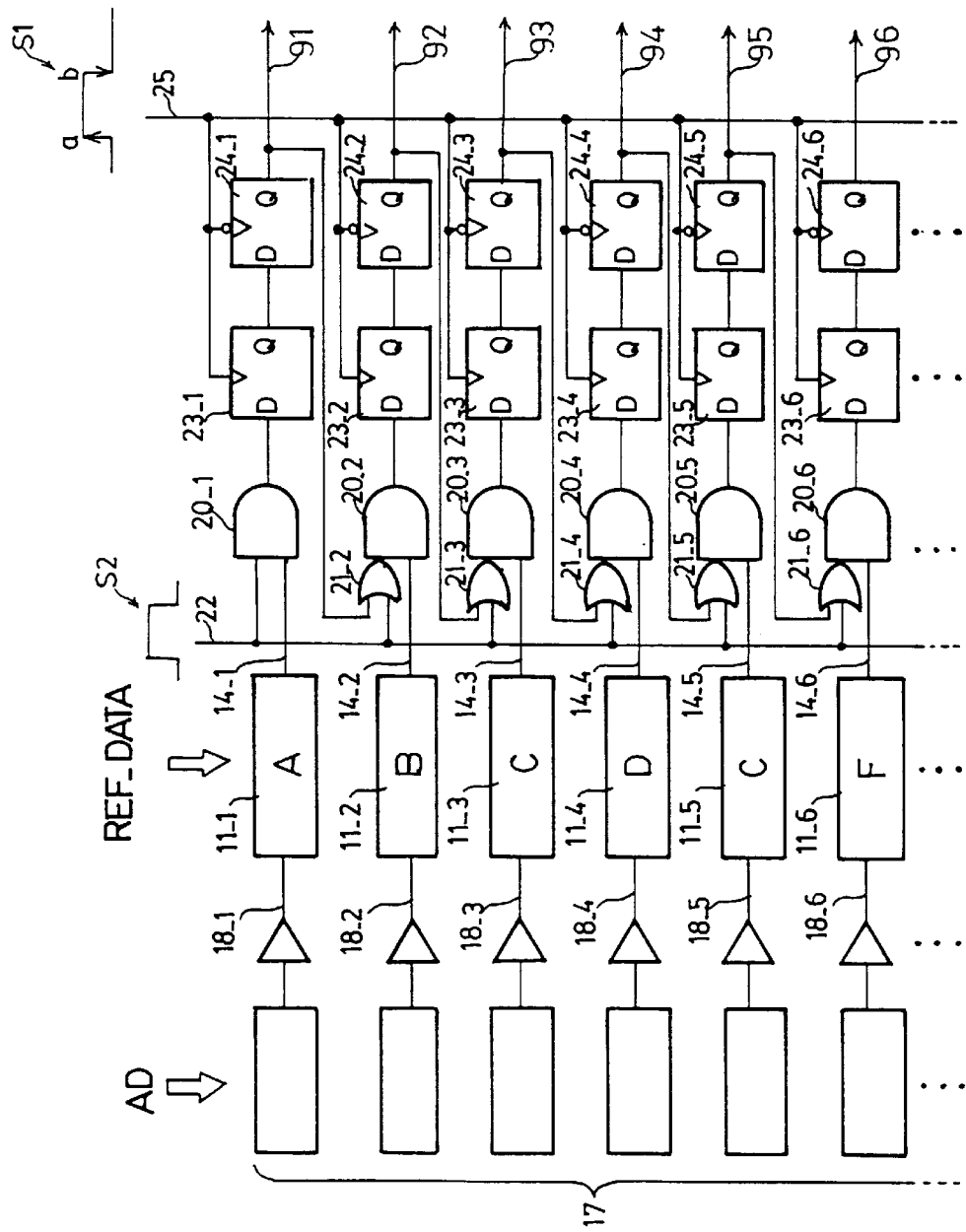
FIG. 11 is a block diagram showing an associative memory having data expansion function by way of example.

In the associative memory arranged as described above, a match retrieval is effected in such a manner as set forth below. With respect to the retrieval of a word of sole data and the first retrieval, those retrievals may be implemented in the same manner as the conventional associative memory having the word expansion function, as shown in FIG. 11. Therefore, the explanation of those retrievals will be omitted. Now, it is assumed in the first retrieval that a logic "1" has been latched by the first and second memory words 23_2 and 24_2 associated with the memory word 11_2 in compliance with the retrieval data REF_DATA consisting of attribute II and data "B". In this condition, upon receipt of a match of the attribute, a logic "1" of signal appears on the attribute match line 30_2 associated with the memory word 11_2. As a result, a logic "1" of signal is latched also by the associated third flag register 31_2, so that the associated first switch 33_2 turns on, whereby a logic "1" of signal stored in the associated second flag register 24_2, which logic "1" is representative of a match of both the attribute and the data, is supplied to the data line 32_1. Simultaneously, the associated second switch 34_2 also turns on. However, this is useless operation for the first retrieval.

Next, let us consider a retrieval through inputting a retrieval data REF_DATA consisting of attribute IV and data "D". In this case, similar to the case of the associative memory shown in FIG. 11, the first time retrieval control line 22 is kept at a logic level "0". In this state, upon receipt of a match of the attribute, a logic "1" of signal appears on the attribute match line 30_4 associated with the memory word 11_4. As a result, the associated second switch 34_2 turns on, so that the logic "1" of signal, appearing on the data line 32_1, of the associated second flag register 24_2 is applied through an OR gate 21_4 to an AND gate 20_4. Hence, when a match of both the attribute IV and the data "D" is detected in the word memory 11_4 and a logic "1" of match signal is supplied to a match line 14_4, a logic "1" of signal is latched, by the associated first and second flag registers 23_4 and 24_4 in compliance with the match result latch signal S1 which appears on the match result latch control line 25, respectively. Whereas a logic "1" of signal supplied to the attribute match line 30_4 is latched by the associated third flag register 31_4, so that the associated first switch 33_4 turns on whereby the logic "1" of signal is supplied to the data line 32_1. In the second time of retrieval, a logic "0" of signal representative of a mismatch of attribute is supplied to the attribute match line 30_2 associated with the memory word 11_2, and thus the associated third flag register 31_2 stores a logic "0" of signal, whereby the first switch 33_2 associated with the memory word 11_2 turns off.

Figure 10:
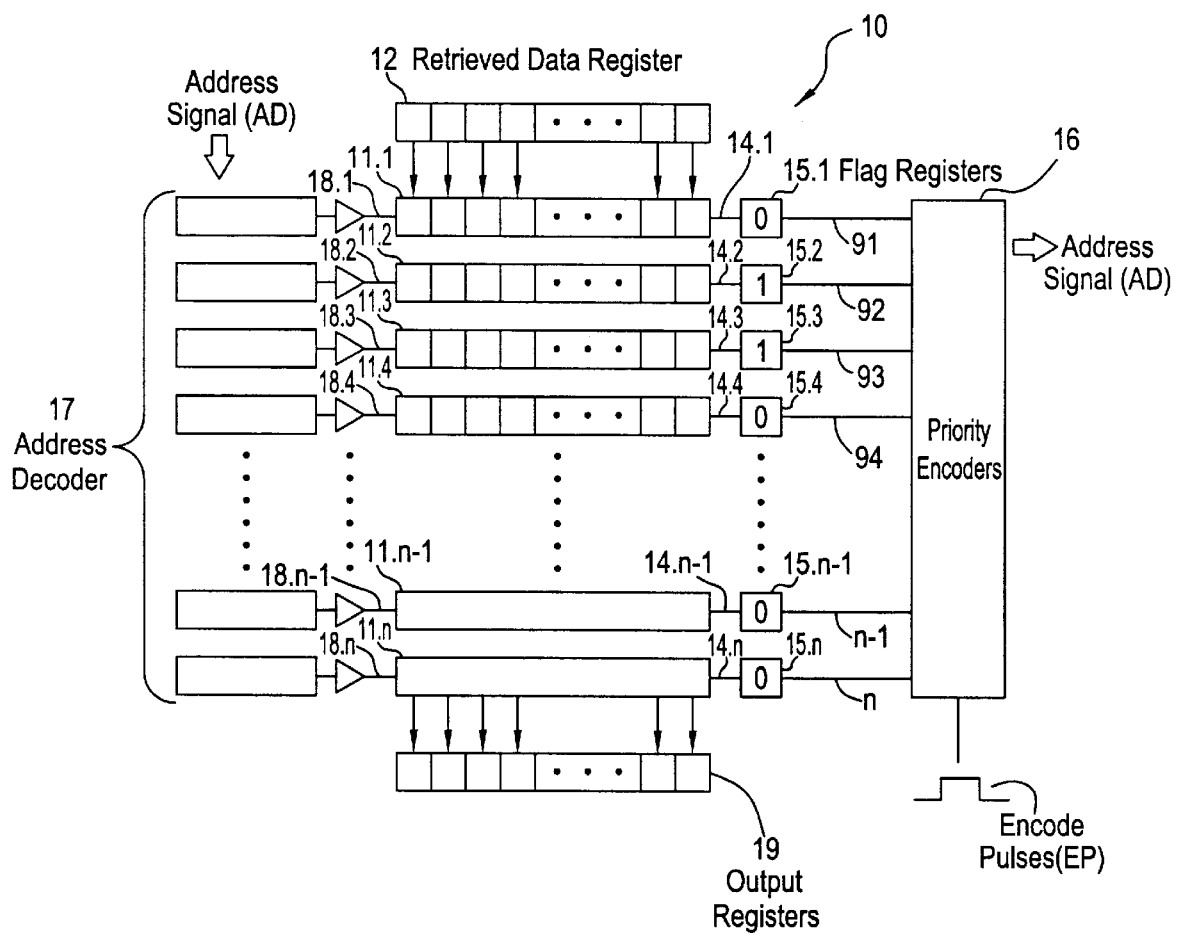
FIG. 10 is a circuit block diagram showing an associative memory by way of example.

Thus, a logic "1" of signal of the second flag register 24_4 associated with the word memory 11_4 is applied through an output line 100_4 to the priority encoder 16 (refer to FIG. 10) so that the address of the memory word 11_4 is derived. Here, it is known beforehand that attribute IV has been stored in the memory word 11_4. Accordingly, when it is desired that data involved in, for example, the attribute III within the same group is read out, it may be sufficient that the address of the memory word 11_3 is determined through subtracting 1 from the derived address, and the determined address is applied to the address decoder 17 to read the content of the memory word 11_3.

In the second time of retrieval, if the retrieval is carried out with the use of the reference data consisting, for example, attribute IV and data "B", instead of the retrieval data consisting attribute IV and data "D", regarding the memory word 11_4, the associated second switch 34_4 turns on since a match of the attribute is attained, so that a logic "1" of signal appearing on the data line 32_1 is taken in. Whereas, since the data is different, a logic "0" of signal representative of a mismatch is supplied to the match line 14_4, so that the first and second flag registers 23_4 and 24_4 latch a logic "0" indicating that no match is detected. Further, regarding the memory word 11_2 involved in a match of data "B", it involves no match of the attribute and thus involving no match of both the attribute and the data.

In such a manner as mentioned above, according to the associative memory shown in FIG. 6, it is possible to implement a retrieval even in a case where data to be retrieved are stored in mutually distant memory words as far as those are within the same group, or a case where the retrieval is effected reversely in a sequence of data stored in the memory words.

According the associative memory shown in FIG. 6, the data line 32_1, 32_2, ..., are each fixed in length on the assumption that the number of data belonging to a single group is predetermined. However, providing such a fixed length of data line causes such a necessity that a maximum of the number of data belonging to a single group is estimated to provide a data line having a length corresponding to the maximum data number. This causes useless memory words when data groups each are constituted of data less than the maximum. Thus, it is preferable to adopt a variable length of data line to meet the number of data belonging to a single group.

Figure 7:
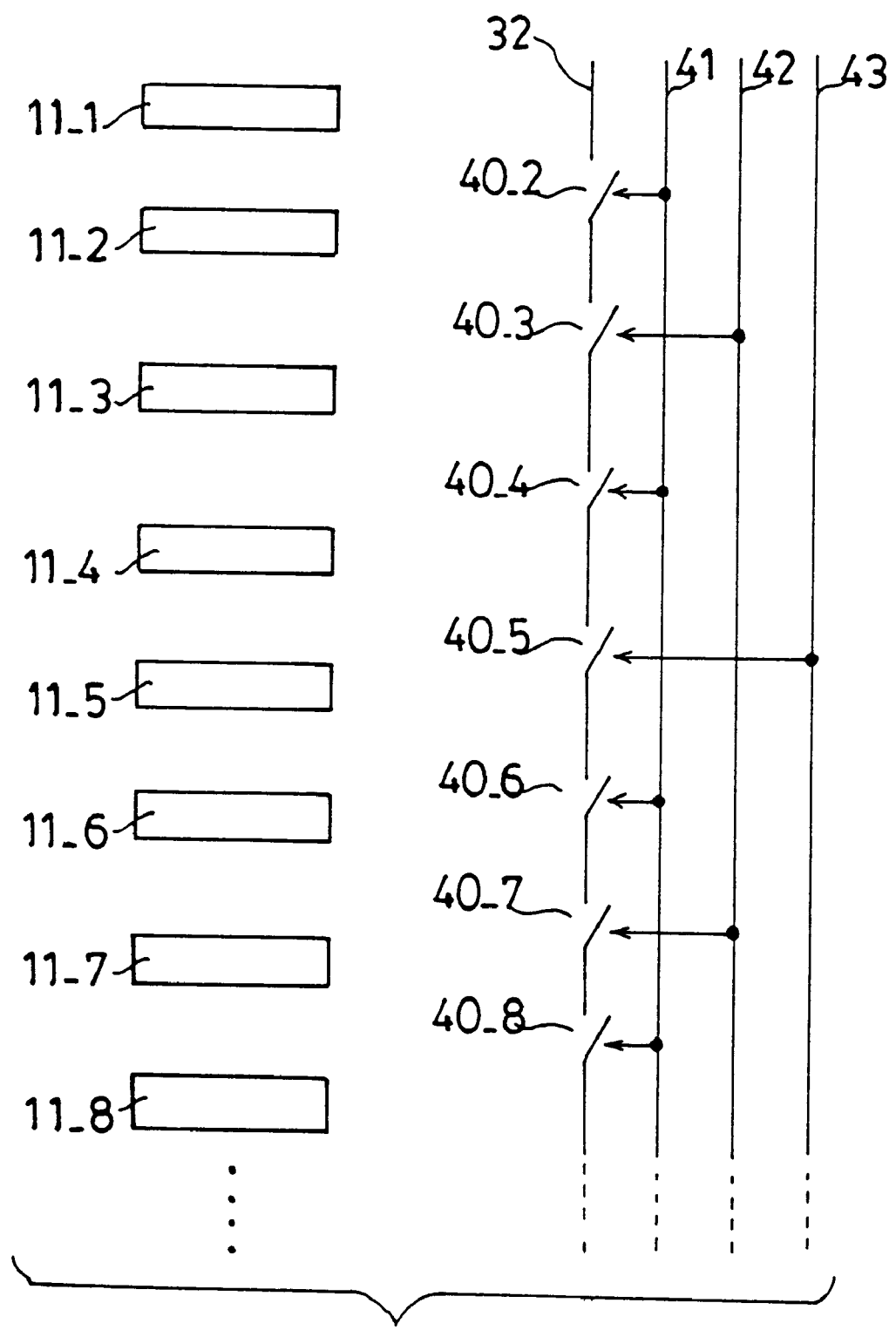
FIG. 7 is a typical illustration showing a scheme of implementing a variable length of data line.

FIG. 7 is a typical illustration showing a scheme of implementing a variable length of data line.

Data line 32 is extended over a plurality of memory words 11_1, 11_2, 11_3, . . . On the data line 32 there are arranged in series switches 40_2, 40_3, 40_4, . . . , which are associated with the memory words 11_2, 11_3, . . . , respectively, except the uppermost stage of memory word 11_1. The switches 40_2, 40_3, 40_4, . . . are disposed between the associated memory words 11_2, 11_3, 11_4, . . . and the immediately upwards adjacent memory words 11_1, 11_2, 11_3, . . . , respectively. Among the switches 40_2, 40_3, 40_4, . . . , the switches 40_2, 40_4, 40_6, . . . disposed every other switch turn on in accordance with the first switch control signal on the first control line 41; the switches 40_3, 40_7, . . . disposed every fourth switch, the second switch control signal on the second control line 42; and the switches 40_5, . . . disposed every ninth switch among the remaining switches, the third switch control signal on the third control line 43.

In a case where the number of data constituting a data group is given with 2, supplying the first switch control signal to the first control line 41 causes the switches 40_2, 40_4, 40_6, . . . disposed every other switch to turn on. Thus, there is formed the data line which is broken in every two memory words 11_1, 11_2; 11_3, 11_4; 11_5, 11_6; . . . In a case where the number of data constituting a data group is given with 4, the first switch control signal is supplied to the first control line 41, and in addition the second switch control signal is supplied to the second control line 42. As a result, there is formed the data line which is broken in every four memory words 11_1, 11_2, 11_3, 11_4; 11_5, 11_6; . . . Likewise, in a case where the number of data constituting a data group is given with 8, the first switch control signal and the second switch control signal are supplied to the first control line 41 and the second control line 42, respectively, and in addition the third switch control signal is supplied to the third control line 43. As a result, there is formed the data line which is broken in every eight memory words 11_1, . . . , 11_8; 11_9, . . .

According to the above-described scheme, in a case where the number of data constituting a data group is given with $2^n$ where n=integer, there occurs no idle in the memory word. However, in case of other than $2^n$, for example, 3, 5, 9, etc., there would occur idle word memories. The constitution, which permits a number of switches switches 40_2, 40_3, . . . to optionally turn on and off, needs a lot of control lines, and also makes a control circuit for supplying the switch control signals to those control lines complicated. Consequently, the scheme shown in FIG. 7 is inadequate to control completely optionally a length of the data line.

Figure 8:
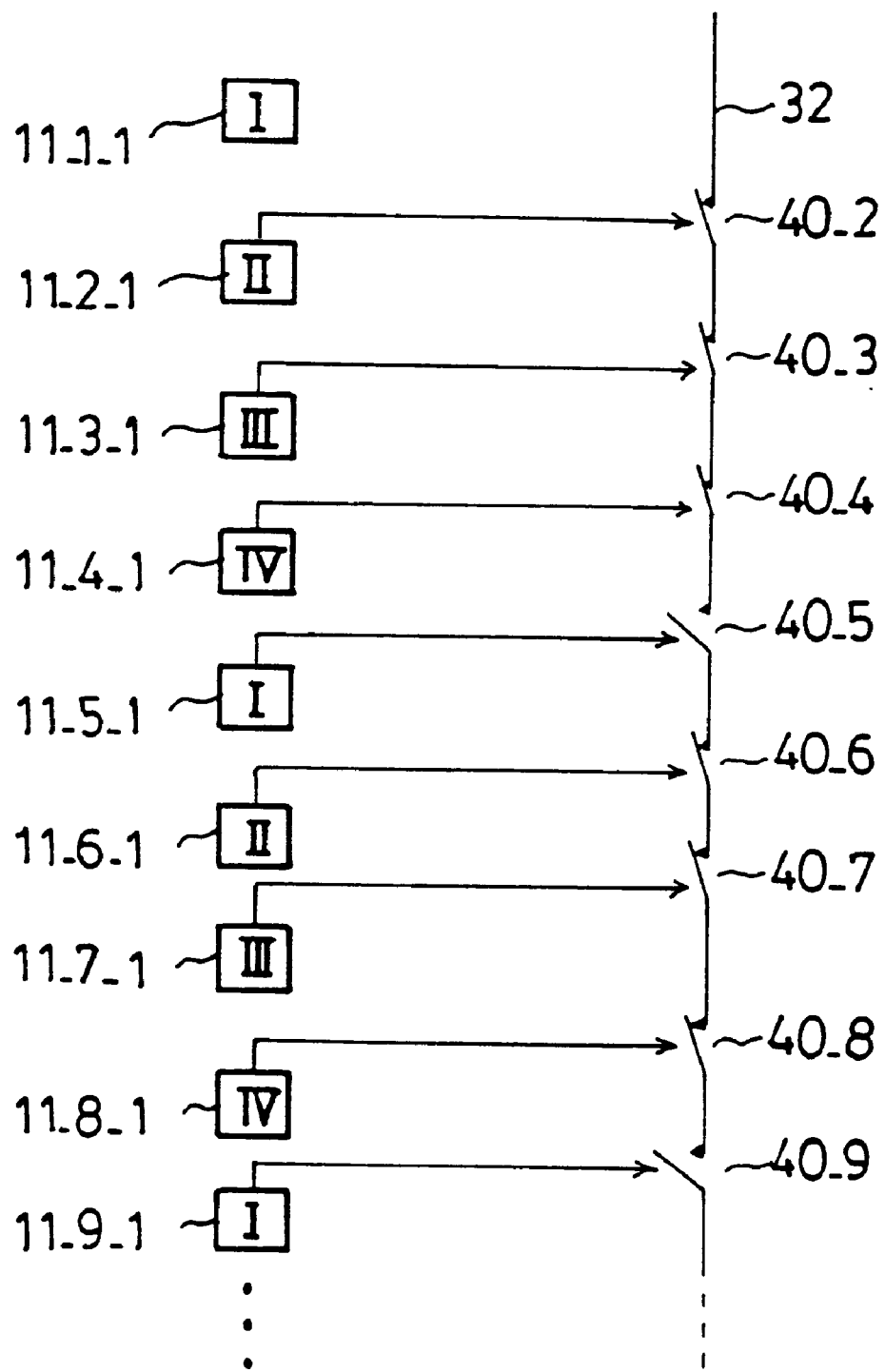
FIG. 8 is a typical illustration showing another scheme of implementing a variable length of data line.

FIG. 8 is a typical illustration showing another scheme of implementing a variable length of data line.

It is the same as the case in FIG. 7 that data line 32 is extended over a plurality of memory words, and on the data line 32 there are arranged in series switches 40_2, 40_3, 40_4, . . . , which are associated with the memory words, respectively, except the uppermost stage of memory word. The memory words are provided with attribute storage units 11_1_1, 11_2_1, 11_3_1, . . . , respectively. In the attribute storage units 11_1_1, 11_2_1, 11_3_1, . . . , there are stored attributes I, II, III and IV as shown in the figure, respectively. According to this example, it is so arranged that the switches are controlled in their turn-on or off depending on the attributes I or other than I, that is, II, III and IV which are stored in the attribute storage units 11_1_1, 11_2_1, 11_3_1, . . . , in such a manner that in case of the attribute I the associated switch is kept off, and in case of the attributes II, III or IV the associated switch is turned on. Such an arrangement makes it possible to form the data line which is broken in every memory words automatically given with an adequate number, independently of the number of data constituting a data group, through disposing attribute I of data at the initial of each data group, even if there are mixed data groups each consisting of a different number of data.

Figure 9:
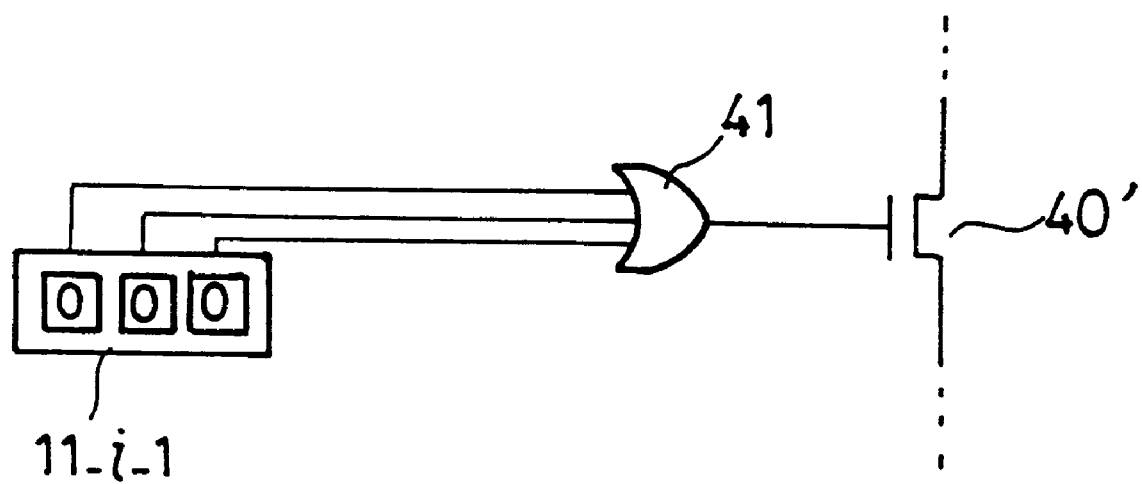
FIG. 9 is a circuit diagram of an attribute determination circuit by way of example.

FIG. 9 is a circuit diagram of an attribute determination circuit for determining as to whether or not an attribute is of "I".

Here, it is assumed that "000" is assigned to the attribute I. When an attribute stored in an attribute storage unit 11_i_1 is the attribute I ("000"), an OR gate 41 produces a logic "0" signal. Thus, a switch comprising a transistor 40 turns off, so that the data line of the transistor 40' is electrically broken in its both sides. When an attribute stored in the attribute storage unit 11_i_1 is other than the attribute I, the OR gate 41 produces a logic "1" signal. Thus, the transistor 40 turns on, so that the data line of the transistor is electrically coupled between its both sides.

In this manner, in the embodiment shown in FIG. 6, it is also to adjust a length of each of the data lines 32_1, 32_2, . . . in accordance with the number of data constituting a data group. It is acceptable, of course, to vary or adjust a length of the data line through controlling the switch with the use of a one bit of control flag for exclusive use, but not utilizing attribute data. Specifically, in a case where a control-dedicated flag bit is provided, there is such a merit that values of the attribute storage units 11_1_1, 11_2_1, . . . can be optionally selected, and it is possible to more easily implement a construction of data as to the group structure shown in FIG. 12.

In the associative memory in which data of a group structure are stored to perform a match retrieval, what is identified as a result of the match is an address of a memory word group in which the matched data group is stored. However, according to the associative memory as mentioned above, there are provided match lines each corresponding to the associated one of a number of memory words, and such match lines are treated on an equal basis. Thus, what is outputted as a result of the match retrieval is, for example, an address of a memory word on which a match is finally detected when a series of retrieval is performed.

Consequently, there is a need to exteriorly perform a management as to what plural addresses correspond to a single memory word group. This involves such a problem that the management is very troublesome.

In view of the foregoing, there will be described a technique capable of facilitating such a management, hereinafter.

Figure 1:
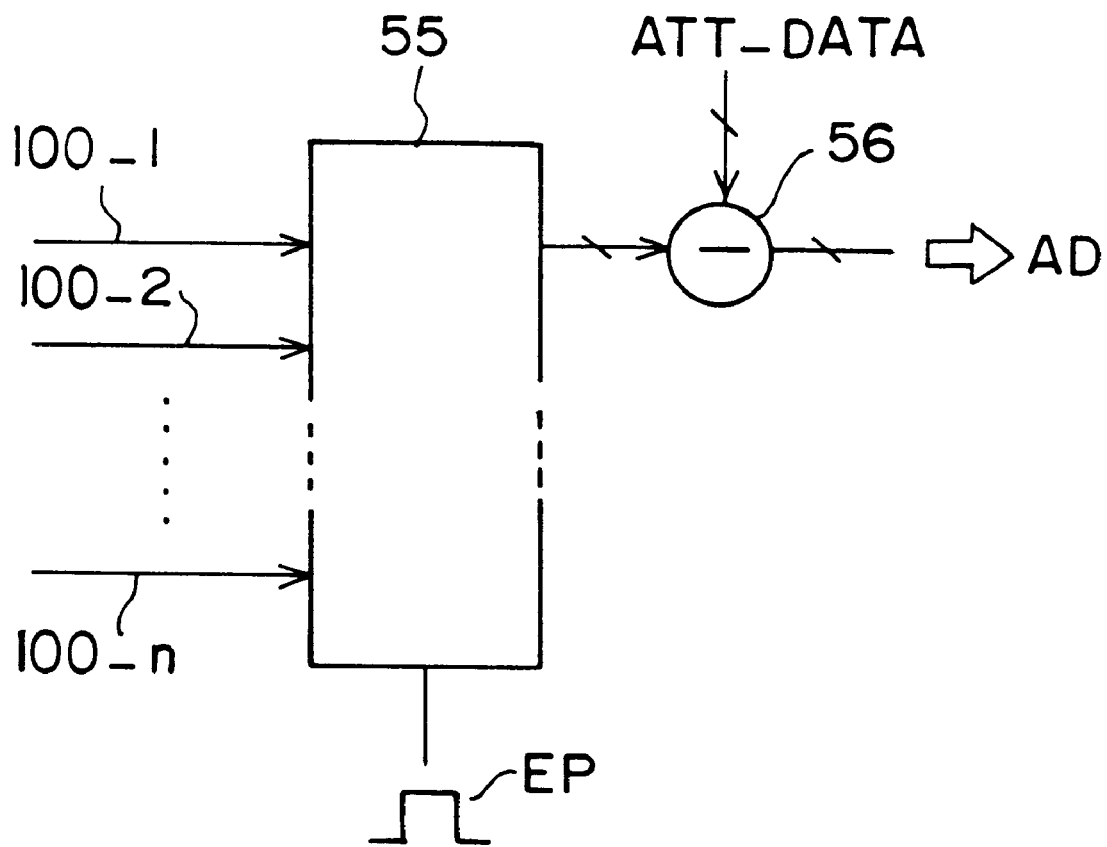
FIG. 1 is a circuit diagram of the first embodiment of the second associative memory of the present invention, wherein an aspect of the present invention is partially illustrated.

FIG. 1 is a circuit diagram of the first embodiment of the second associative memory of the present invention, wherein an aspect of the present invention, that is, a portion of a priority encoder 55, is partially illustrated.

Signals from the match lines 14_1, 14_2, . . . , 14_n each corresponding to the associated one of the memory words (refer to FIG. 6) are coupled through the flag registers 23_1, 24_1; 23_2, 24_2; . . . to the priority encoder 55.

The priority encoder 55 outputs an address associated with the enabled match line in response to an entry of the encode pulse EP. The address thus outputted is an address corresponding to a specified memory word, and it is not always a representative address of the memory group to which the address of concern belongs.

The address outputted from the priority encoder 55 is applied to a subtracter 56 which is an example of an address converter referred to in the present invention. The subtracter 56 receives also numerical values (binary numbers "000", "001", "010" and "011" associated with attributes I, II, III and IV, respectively, which are referred to as attribute data ATT_DATA). Thus, the subtracter 56 serves to subtract the value of the attribute data, which has been immediately before retrieved, from the address outputted from the priority encoder 55. Thus, the address outputted from the priority encoder 55 always assumes a representative address AD of the memory word group to which the associated memory word belongs. In other words, the attribute data ATT_DATA is representative of the relative address within the memory word group. Here, the youngest address in number among addresses of a plurality of memory words constituting the memory word group is assigned as the representative address of the memory word group.

Figure 2:
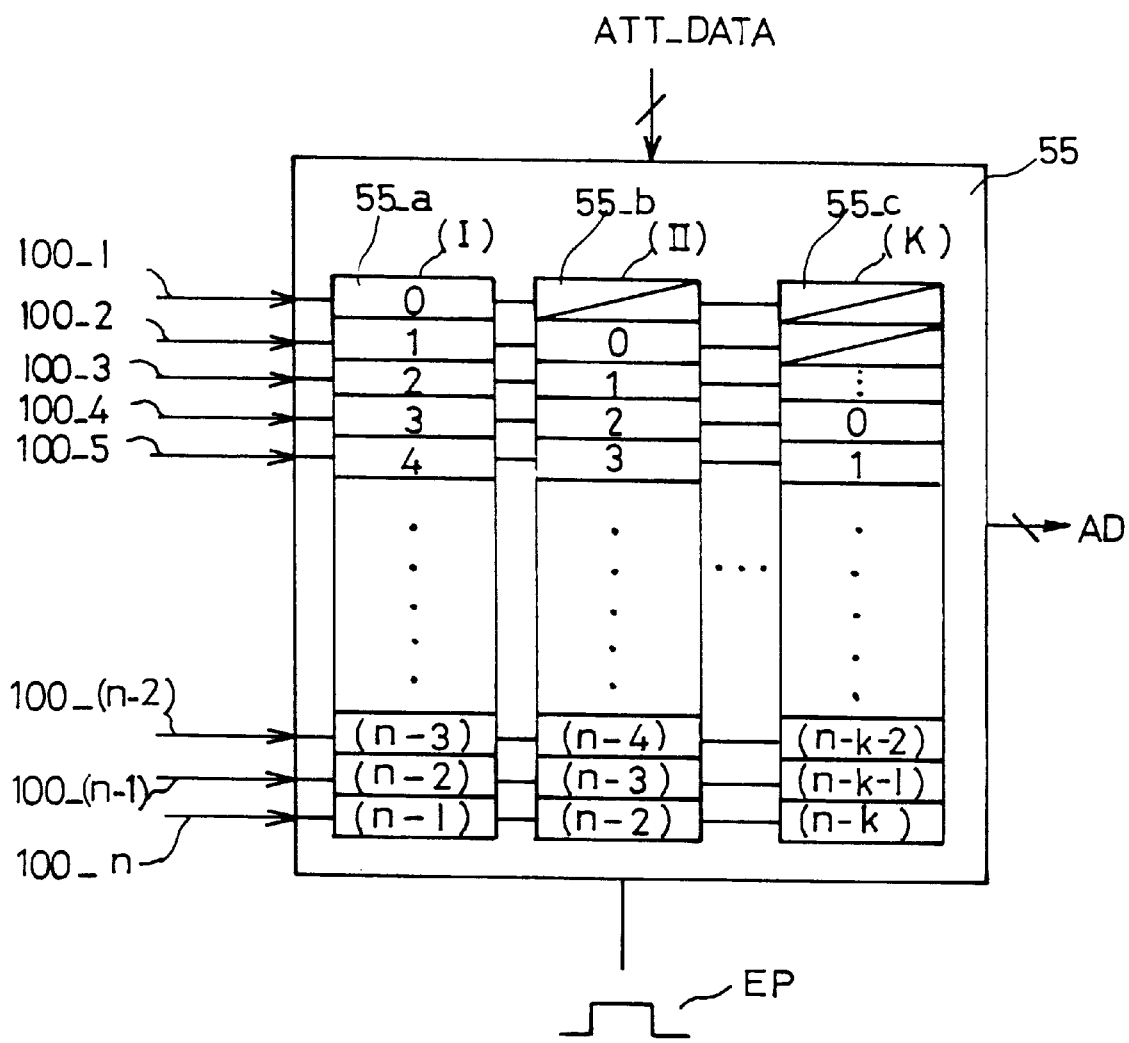
FIG. 2 is a circuit diagram of the second embodiment of the second associative memory of the present invention, wherein an aspect of the present invention is partially illustrated.

FIG. 2 is a circuit diagram of the second embodiment of the second associative memory of the present invention, wherein the priority encoder 55 is partially illustrated.

A point different from the first embodiment resides in the structure of the priority encoder 55. According to the first embodiment, the value of the attribute data, which has been immediately before retrieved, is subtracted from the address outputted from the priority encoder. And the youngest address in number among addresses of a plurality of memory words constituting the memory word group is assigned as the representative address of the memory word group. By the way, according to the first embodiment, in order to perform the subtraction as mentioned above, the processing time Δt is needed. The present embodiment aims to omit the subtraction time. Specifically, as shown in FIG. 2, the priority encoder 55 is provided with encoders 55_a, 55_b and 55_c which correspond to the sorts of the attribute data. The encoders 55_a, 55_b and 55_c are selected according as the retrieval immediately before is involved in what attribute. The encoding address AD is derived from the output of the selected encoder.

For example, if the output line 100_2 is given with 1 and the retrieval immediately before is performed for attribute II ("001"), the encoder 55_b is selected in accordance with the attribute data ATT_DATA.

The value associated with the output line 100_2 of the encoder 55_b is "0", and this value is outputted as the representative address AD. This means that the youngest address "0" of the memory word group to which the memory word associated with the output line 100_2 belongs is outputted.

The selection of the encoder 55_b has been already determined in accordance with the attribute data ATT_DATA at the time of retrieval just before the encoding is initiated. Thus, there is no need to provide a delay as the subtracter 56 other than the priority encoder 55 as in the first embodiment.

Figure 3:
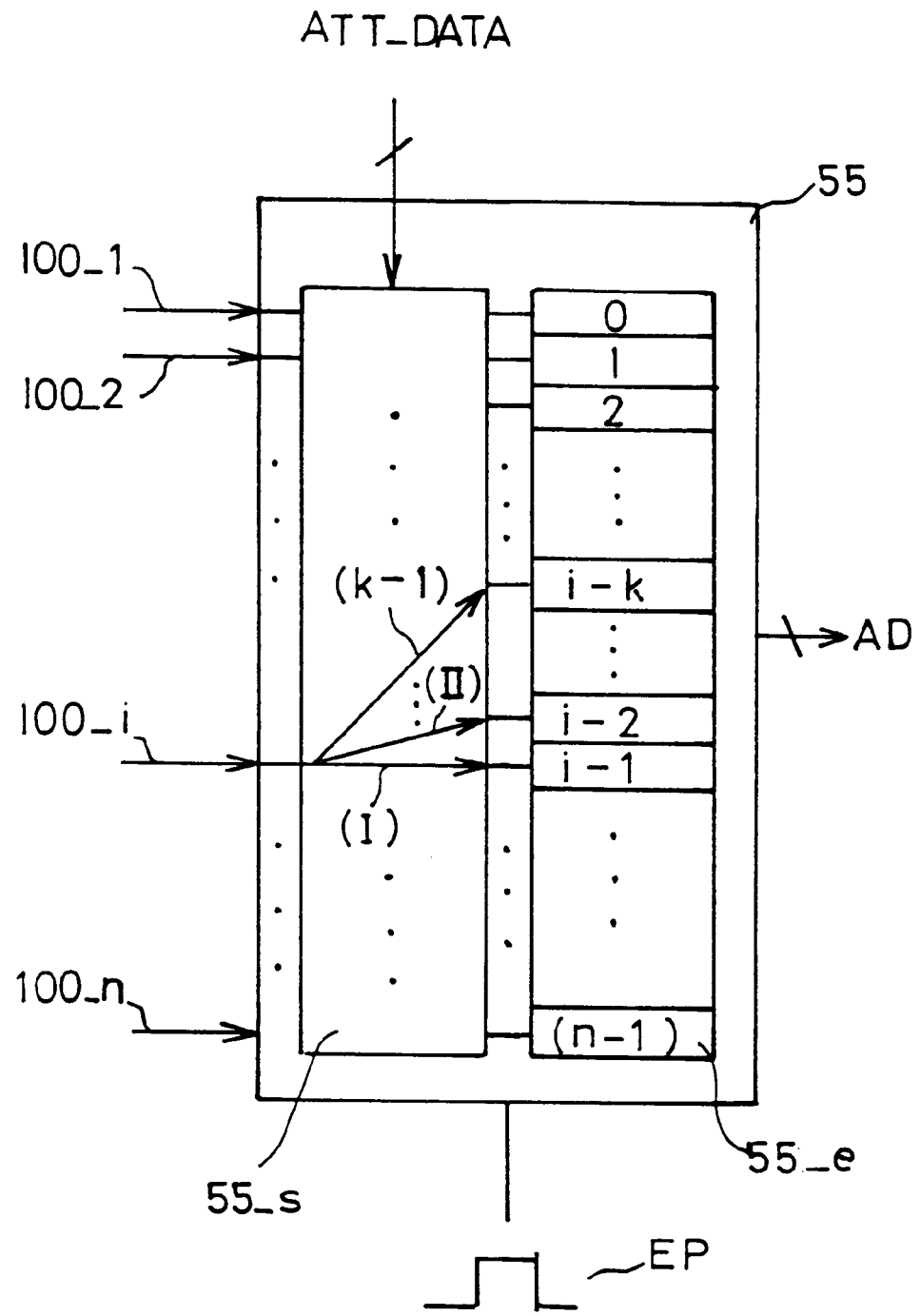
FIG. 3 is a circuit diagram of the third embodiment of the second associative memory of the present invention, wherein an aspect of the present invention is partially illustrated.

Further, FIG. 3 is a circuit diagram of the third embodiment of the second associative memory of the present invention. A feature of the present embodiment also resides in the structure of the priority encoder 55.

The embodiment shown in FIG. 2 has no delay by the subtracter 56 in comparison with that in FIG. 1. However, there is a need to prepare the encoders 55_a, 55_b and 55_c by the number corresponding to the sorts of the attribute. Thus an area for the hardware will be increased. This problem has been improved in accordance with the embodiment shown in FIG. 3.

A switching 55_s is provided between the output lines 100_1, 100_2 . . . 100_n, which serve as inputs of the priority encoder 55, and the encoder 55_e.

An important feature of the present embodiment resides in the point that the switching 55_s is controlled in accordance with the attribute data ATT_DATA so that the connection position to the encoder 55_e is changed.

For instance, output line 100_i is permitted to selectively output to any of (i-k) to (i-l) of the encoder 55_e in accordance with the switching 55_s.

Where k denotes a value of the attribute of the retrieval performed immediately before the encoding, and satisfies the condition $0 \leq i \leq n$, $i \geq k$.

Thus, when the attribute is given with k, the output of the encoder 55_e assumes i-k, thereby outputting the youngest address of the memory word group to which the memory word of the output line 100_i belongs.

This arrangement makes it possible to minimize a delay time for obtaining the encoding address AD, and minimize a hardware area as well.

Next, an additional embodiment is intended to practice further improvement in outputs of a retrieval result which are applied to the priority encoder 55.

Figure 4:
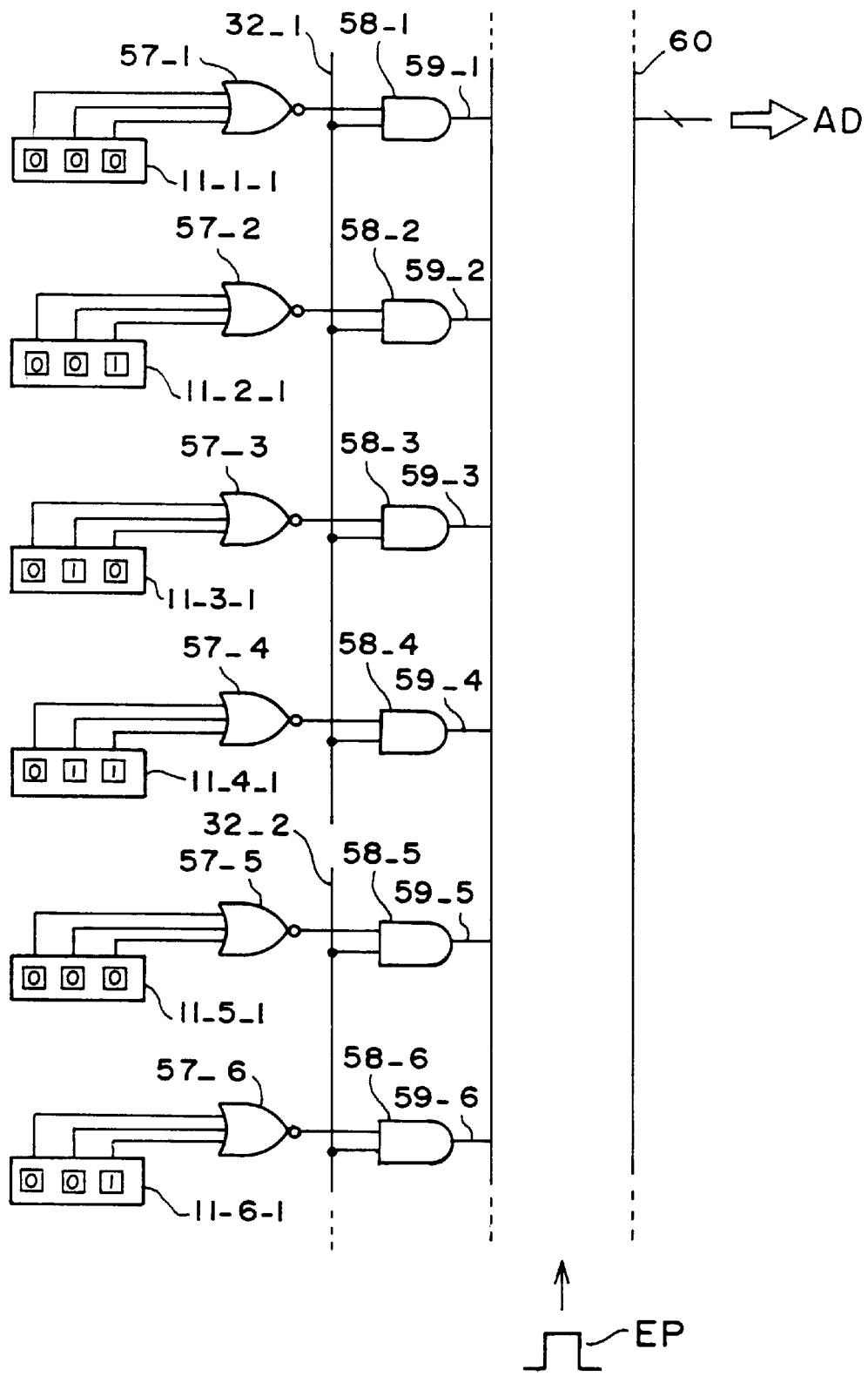
FIG. 4 is a circuit diagram of the fourth embodiment of the second associative memory of the present invention, wherein an aspect of the present invention is partially illustrated.

FIG. 4 is a circuit diagram of the fourth embodiment of the second associative memory of the present invention, wherein an aspect of the present invention, that is, an output portion for the retrieval result, is partially illustrated.

In FIG. 4, there are shown data lines 32_1, 32_2 . . . which are the same as those in FIG. 6. As described referring to FIG. 6, transmitted to the data lines 32_1, 32_2 . . . are signals of the match lines 14_1, 14_2 . . . through AND gates 20_1, 20_2 . . . , flag registers 23_1, 24_2; 23_2, 24_2; . . . , and switches 33_1, 33_2 . . .

Further, in FIG. 4, there are shown attribute storage units 11_1_1, 11_2_1, . . . In a case where the attribute stored in the attribute storage units is attribute I ("000") (in case of FIG. 4, the attribute storage units 11_1_1 and 11_5_1 store attribute I ("000")), the associated NOR gates 57_1, 57_2 . . . , (in case of FIG. 4, NOR gates 57_1 and 57_5) output logic "1". The outputs of the NOR gates 51_1, 51_2 . . . are applied to AND gates 58_1, 58_2 . . . , respectively, through one of their input terminals.

Another input terminals of the AND gates 58_1, 58_2 . . . are connected to the data lines 32_1, 32_2 . . . each corresponding to the memory word group to which the associated memory word belongs, respectively. The output terminals of the AND gates 58_1, 58_2 . . . are connected through signal lines 59_1, 59_2 . . . to a priority encoder 60, respectively.

As described referring to FIG. 6, the data lines 32_1, 32_2 . . . are arranged to receive a match signal (logic "1") when a match is detected on anyone of the memory words which constitute the associated memory word group. Consequently, the AND gates 58_1, 58_2 . . . output logic "1" to the priority encoder 60, when the associated memory word stores the attribute I ("000") and a match is detected on anyone of memory words of the memory word group to which the associated memory word belongs. On the other hand, in cases of the matter beyond that, that is, in a case where a match is not detected on any of the memory words constituting the memory word group to which the associated memory word belongs, or in a case where while the match is detected, the associated attribute is other than the attribute I ("000"), the AND gates 58_1, 58_2 . . . output logic "0" to the priority encoder 60. In this manner, the priority encoder 60 receives a signal of logic "1" representative of a detection of match through only the AND gate corresponding to the first memory word of a plurality of memory words constituting the memory word group on which a match has been detected. Therefore, the priority encoder 60 may output the first address of the memory word group on which a match has been detected, as the representative address AD, in accordance with the encoding pulse EP.

According to the embodiment shown in FIG. 4, while the attribute data is adopted as information for distinguishing between the memory word groups each storing data set, the third associative memory of the present invention is not restricted to that using the attribute data, in a similar fashion to that of the second associative memory of the present invention. It is acceptable, for example, when the memory word groups are distinguished from each other by the control signal, as shown in FIG. 7, to use such a control signal, alternatively of course to use a cont rol-dedicated flag bit. Specifically, in a case where the control-dedicated flag bit is provided, it involves such a merit that the values of the attribute storage units 11_1_1, 11_2_1, . . . and so on can be optionally selected, thereby more facilitating the construction of data as to the group structure as shown in FIG. 12.

The above-mentioned matter relates to a detection of the representative address of a retrieval result. On the other hand, in case of the associative memory, as another important address there is an empty address for a data-empty area. Hereinafter, there will be described a management method of this address.

With respect to the empty address, however, it does not happen that the position is varied in accordance with the attribute to be retrieved. In this respect, there is a difference from a determination of the representative address of a result of the retrieval.

The term "empty" is to distinguish between the states of the memory word in one of which the memory word is in condition of a "storage state" in which the memory word stores effective retrieval data as an object of the retrieval, and in another state the memory word is in condition of a "empty state" in which the memory word does not store effective retrieval data and thus permits overwrite. A plurality of empty flag registers each storing a flag are each provided corresponding to the associated one of the memory words. In retrieval, when the empty flag register stores a flag indicative of the fact that the associated memory word is in the storage state, that memory word is treated as an object of the retrieval. On the other hand, when the empty flag register stores a flag indicative of the fact that the associated memory word is in the empty state, that memory word is withdrawn from an object of the retrieval.

As mentioned above, in a case where the memory words store each both the attribute and data, with respect to identification as to whether the memory word is in the storage state or the empty state, it is sufficient to perform such an identification for each memory word group storing data set. However, as shown in FIGS. 7 and 8, in a case where a distinction between the memory word groups is not given beforehand and thus the distinction between the memory word groups is determined in accordance with the control signal or the attribute, the empty flag register is provided for each memory word, as mentioned above.

Those empty flag register are connected to the priority encoder. When new data is written into a memory word, the priority encoder generates an address of a memory word which is in the empty state, and a desired data is written into the memory word involved in the generated address. In this case, essentially, it is sufficient to determine as to whether the memory word groups each storing data set are in the empty state in their units. However, in a case where the empty flag registers each provided for the associated one of the memory words are connected to the priority encoder, there is a need to select a desired memory word which is in the empty state through applying a number of encoding pulses EP (see FIG. 10) to the priority encoder. This involves such a problem that a procedure of writing of data is complicated and it takes a long time to write data.

Figure 5:
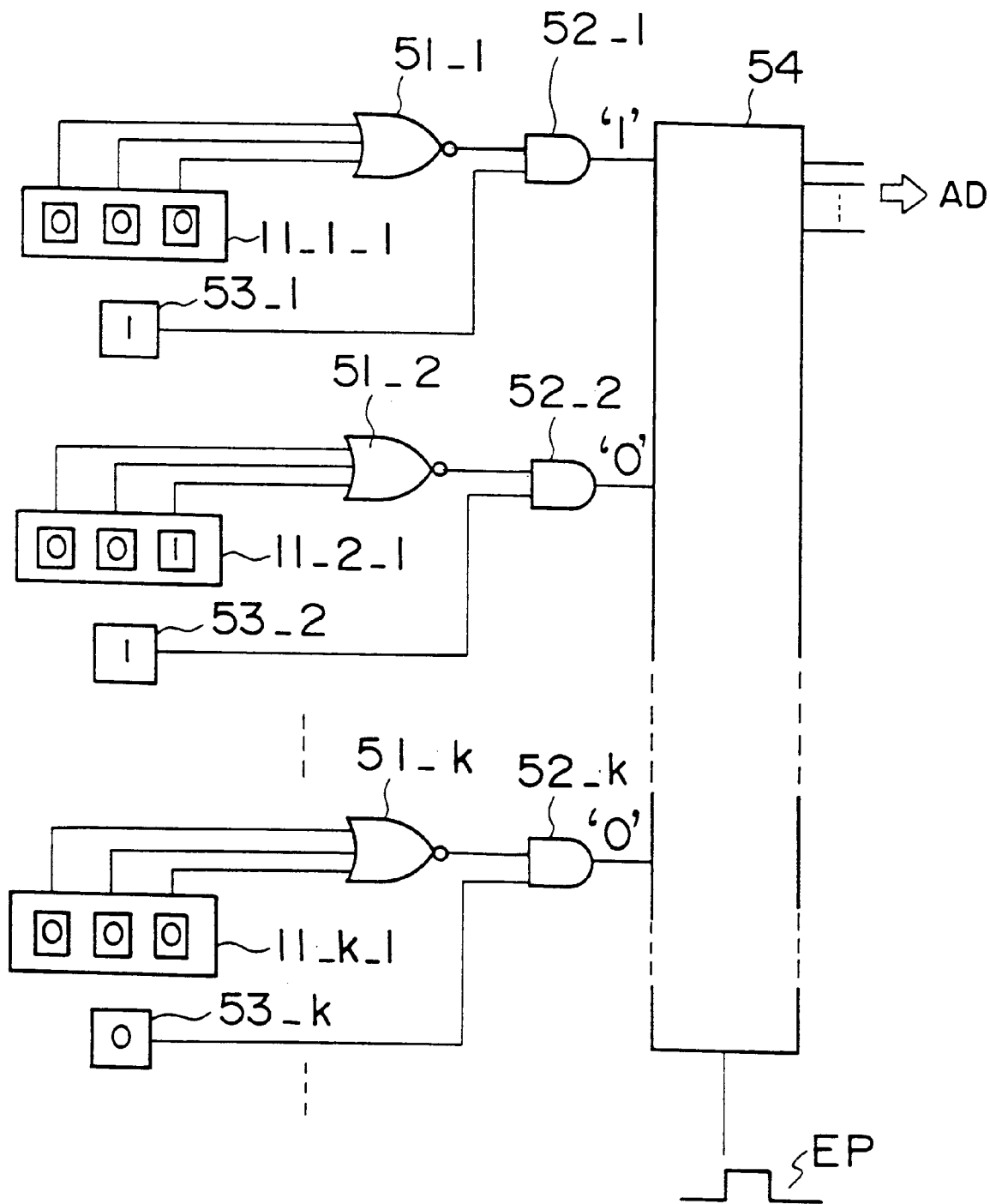
FIG. 5 is a circuit diagram of one embodiment of the third associative memory of the present invention, wherein an aspect of the present invention is partially illustrated.

FIG. 5 is a circuit diagram of one embodiment of the third associative memory of the present invention, wherein an aspect of the present invention is partially illustrated.

It is assumed that data having a data structure as shown in FIG. 12 is stored and "000" is assigned to attribute I. In a case where the attribute stored in the attribute storage units 11_1_1, 11_2_1, . . . 11_k_1, . . . is an attribute I ("000") (in case of FIG. 5, the attribute storage units 11_1_1 and 11_k_1 store attribute I ("000")), the associated NOR gates 51_1, 51_2 . . . , 51_k, . . . (in case of FIG. 5, NOR gates 51_1 and 51_k) output logic "1". The outputs of the NOR gates 51_1, 51_2, . . . , 51_k, . . . are applied to AND gates 52_1, 52_2, , 52_k, . . . , respectively, through one of their input terminals.

Empty flag registers 53_1, 53_2, . . . , 53_k, . . . , each provided for the associated one of the memory words (not shown in FIG. 5), store logic "1" indicative of the fact that the memory words associated with the empty flag registers 53_1, 53_2, . . . , 53_k, . . . are each in the empty state, or logic "0" indicative of the fact that the associated memory words store each effective data as an object of the retrieval. Data of logic "1" or "0" stored in the empty flag registers 53_1, 53_2, . . . , 53_k, . . . are applied to another input terminals of the associated AND gates 52_1, 52_2, . . . , 52_k, . . . , respectively. Outputs of the AND gates 52_1, 52_2, . . . , 52_k, . . . are applied to the priority encoder 54.

Whenever the priority encoder 54 receives the encoding pulse EP, addresses AD of the memory words associated with the AND gates 52_1, . . . outputting logic "1" are sequentially outputted in accordance with a predetermined priority sequence.

According to the arrangement as shown in FIG. 5, only when the attribute storage units 11_1_1, 11_2_1, . . . , 11_k_1, . . . store "000" representative of attribute I and the empty flag registers 53_1, 53_2, . . . , 53_k, . . . store logic "1" indicative of the empty state, the priority encoder 54 receives logic "1". On the other hand, when the attribute storage units 11_1_1, 11_2_1, . . . , 11_k_1, . . . store attributes other than attribute I, or the empty flag registers 53_1, 53_2, . . . , 53_k, . . . store logic "0" indicative of the fact that the associated memory words store each effective data, the priority encoder 54 receives logic "0".

In this manner, the priority encoder 54 receives logic "1" when the memory words each representing data set, which store data of attribute I, are in the empty state. Thus, it is possible to simplify the sequence when an address of a desired memory word is derived through entry of the encoding pulse EP, and also to enhance a speed of data writing to the desired memory word.

Further, according to the arrangement as mentioned above, simply varying the value of one bit of the empty flag of the memory word in which attribute I of data is written among a series of memory words in which effective data sets have been written makes it possible to cause the series of memory words to be in the empty state, thereby very effectively erasing the data.

The priority encoder 54 shown in FIG. 5 is different from the priority encoder 16 shown in FIG. 1 simply in such a point that when data is written, an address of the memory word which is in the empty state is derived, otherwise an address of the memory word on which a match detection is detected as a result of the retrieval is derived, but they are common in their structure.

Further, according to the embodiment shown in FIG. 5, attribute data are used as information for distinction between the memory word groups each storing data set. But the present invention is not restricted to this fashion. For example, as shown in FIG. 7 in a case where a distinction between the memory word groups is determined by a control signal, it is acceptable to use the control signal, alternatively, of course, to use a control-dedicated flag bit.

We claim:

1. An associative memory that stores storage data, when retrieval data is entered, storage data associated with the entered retrieval data being retrieved, comprising:

a plurality of memory words for storing the storage data, the storage data being organized into a plurality of data groups, each of the data groups comprising a plurality of storage data of sets;

a plurality of flag registers, each of the flag registers corresponding to an associated one of said plurality of memory words, each of the flag registers storing an empty flag which indicates either that the associated memory word is in a storage state storing effective retrieval storage data as an object of retrieval, or that the associated memory word is in an empty state storing no effective retrieval storage data and thus permitting overwrite;

a gate circuit having signal lines each corresponding to a location associated with one of said plurality of memory words, said gate circuit enabling a signal line corresponding to a location of a memory word when the storage data stored in said memory word is storage data representative of a data group to which said storage data belongs, and the flag register corresponding to the location of the memory word storing said storage data stores the empty flag indicative of the empty state; and a priority encoder for designating one of the memory words associated with the signal line enabled by said gate circuit in accordance with a predetermined priority sequence.

2. An associative memory according to claim 1, wherein each of said storage data of sets includes a pair of attribute and data, the attribute being indicative of a position in a data group to which each of the storage data of sets belongs; and said gate circuit enabling the signal line when the attribute stored in said memory word is a predetrmined attribute representative of said data group, and the flag register associated the memory word storing said predetermined attribute stores the empty flag indicative of the empty state.

3. An associative memory that stores storage data, when retrieval data is entered, storage data associated with the entered retrieval data being retrieved, the associative memory comprising:

a plurality of memory words for storing the storage data, the storage data being organized into a plurality of data groups, each of the data groups comprising a plurality of storage data of sets, said plurality of memory words being organized into a plurality of memory word groups, each of the memory word groups storing storage data of one of the data groups;

a plurality of match lines, each of the match lines corresponding to an associated memory word of said plurality of memory words, each of the match lines being enabled when the associated memory word stores the storage data associated with the entered retrieval data;

a priority encoder for generating and outputting addresses of memory words associated with enabled match lines in accordance with a predetermined priority sequence; and an address converter for converting an address of one memory word of the memory words that is output from said priority encoder into a representative address associated with a memory word group to which said one memory word belongs.

4. An associative memory according to claim 3, wherein each of said storage data of sets includes a pair of attribute and data, the attribute being indicative of a position in a data group to which each of the storage data of sets belongs, and said address converter generates the representative address by performing addition or subtraction of the address of the one memory word and a relative address between the one memory word and a memory word storing a predetermined attribute, the predetermined attribute being representative of attributes of memory words of the memory word group to which the one memory word belongs.

5. An associative memory that stores storage data, when retrieval data is entered, storage data associated with the entered retrieval data being retrieved, wherein each of a plurality of storage data of sets includes a pair of attribute and data, the attribute being indicative of a position in a data group to which each of the storage data of sets belongs, the associative memory comprising:

a plurality of memory words for storing the storage data, the storage data being organized into a plurality of data groups, each of the data groups comprising the plurality of storage data of sets, said plurality of memory words being organized into a plurality of memory word groups, each of the memory word groups storing storage data of one of the data groups;

a plurality of match lines, each of the match lines corresponding to an associated memory word of said plurality of memory words, each of the match lines being enabled when the associated memory word stores the storage data associated with the entered retrieval data; and a plurality of encode coding circuits, each of the circuits corresponding to one attribute and generating a representative address of a memory word group to which a memory word associated with an enabled match line belongs, the circuits being selected based on an attribute determined at a time of retrieval.

6. An associative memory that stores storage data, when retrieval data is entered, storage data associated with the entered retrieval data being retrieved, wherein each of a plurality of storage data of sets includes a pair of attribute and data, the attribute being indicative of a position in a data group to which each of the storage data of sets belongs, the associative memory comprising:

a plurality of memory words for storing the storage data, the storage data being organized into a plurality of data groups, each of the data groups comprising the plurality of storage data of sets, said plurality of memory words being organized into a plurality of memory word groups each of the memory word groups storing storage data of one of the data groups;

a plurality of match lines, each of the match lines corresponding to an associated memory word of said plurality of memory words, each of the match lines being enabled when the associated memory word stores the storage data associated with the entered retrieval data;

a switching circuit controlled by an attribute determined at a time of retrieval, the switching circuit receiving an enabled match line at an input position corresponding to an address of a memory word associated with the enabled match line, and shifting the input position by a difference between the address and a representative address associated with a memory word group to which the memory word associated with the enabled match line belongs to generate a shifted enabled match line; and an encode coding circuit for receiving the shifted enabled match line and for generating a new address based on the shifted enabled match line.

7. An associative memory that stores storage data, when retrieval data is entered, storage data associated with the entered retrieval data being retrieved, the associative memory comprising:

a plurality of memory words for storing the storage data, the storage data being organized into a plurality of data groups, each of the data groups comprising a plurality of storage data of sets, said plurality of memory words being organized into a plurality of memory word groups, each of the memory word groups storing storage data of a corresponding one of the data groups;

a plurality of match lines, each of the match lines corresponding to an associated memory word of said plurality of memory words, each of the match lines being enabled when the associated memory word stores storage data associated with the entered retrieval data;

a gate circuit having a plurality of signal lines, each of the signal lines corresponding to an associated one of said plurality of memory words, when a match line corresponding to a first memory word of a memory word group is enabled at a time of retrieval, the gate circuit enabling a signal line corresponding to a second memory word of the memory word group that stores storage data representative of a data group corresponding to the memory word group; and a priority encoder for generating an address of the second memory in accordance with a predetermined priority sequence, and for outputting the generated address as a representative address associated with the memory word group to which the first and second memory words belong.

8. An associative memory according to claim 7, wherein said storage data of sets includes a pair of attribute and data, the attribute being indicative of a position in a data group to which the storage data of sets belongs, and said gate circuit enables the signal line when the attribute stored in said second memory word is a predetermined attribute representative of said data group, and any one of the match lines corresponding to a memory word of the memory word group to which the second memory word storing said predetermined attribute belongs is enabled.

* * * * *